(12) United States Patent
Dotta (10) Patent No.: US 7,365,440 B2
(45) Date of Patent: Apr. 29, 2008

(54) SEMICONDUCTOR DEVICE AND FABRICATION METHOD THEREOF

(75) Inventor: Yoshihisa Dotta, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 93 days.

(21) Appl. No.: 11/236,806

(22) Filed: Sep. 28, 2005

(65) Prior Publication Data
US 2006/0071347 A1    Apr. 6, 2006

(30) Foreign Application Priority Data
Oct. 4, 2004   (JP) .............................. 2004-291863

(51) Int. Cl.
*H01L 23/48* (2006.01)
(52) U.S. Cl. ........................ 257/781; 257/774; 257/698
(58) Field of Classification Search ................ 257/698, 257/774, E23.011, 781
See application file for complete search history.

(56) References Cited

U.S. PATENT DOCUMENTS 6,791,195 B2    9/2004   Urushima

| 2003/0080408 | A1* | 5/2003 | Farnworth et al. .......... 257/698 |
| 2003/0151144 | A1* | 8/2003 | Muta et al. .................. 257/774 |
| 2003/0190799 | A1 | 10/2003 | Kung et al. |
| 2004/0063268 | A1* | 4/2004 | Noma et al. ................. 438/202 |
| 2004/0124513 | A1 | 7/2004 | Ho et al. |

FOREIGN PATENT DOCUMENTS

| JP | 3186941 | 5/2001 |
| JP | 2003-309221 | 10/2003 |
| TW | 530344 | 5/2003 |
| TW | 552694 | 9/2003 |

\* cited by examiner

*Primary Examiner*—Douglas M. Menz
(74) *Attorney, Agent, or Firm*—Nixon & Vanderhye P.C.

(57) ABSTRACT

A semiconductor device includes a second insulating film formed on a second surface of a semiconductor substrate whose first surface has been formed with a first insulating film and an electrode pad, and an opening is made in a portion of the second insulating film directly below the electrode pad. By using the second insulating film as a mask, a through hole is formed in the semiconductor substrate in such a manner that the through hole recedes from an opening edge of the first insulating film. A third insulating film is formed only on the inner wall of the through hole.

6 Claims, 8 Drawing Sheets

SEMICONDUCTOR DEVICE AND FABRICATION METHOD THEREOF

This Nonprovisional application claims priority under 35 U.S.C. § 119(a) on Patent Application No. 291863/2004 filed in Japan on Oct. 4, 2004, the entire contents of which are hereby incorporated by reference.

FIELD OF THE INVENTION

The present invention relates to a semiconductor device and a fabrication method of a semiconductor device, and particularly to a semiconductor device and a fabrication method thereof in which a feedthrough electrode is formed.

BACKGROUND OF THE INVENTION

Over the last years, there has been increasing demand for smaller and thinner semiconductor devices. In this connection, a technique of increasing the packaging density by stacking a plurality of semiconductor devices has also been widely adapted. In view of these demands, there has been developed a technique of forming a feedthrough electrode, which connects the electrode pad formed on the front surface of the semiconductor device to the rear surface through a semiconductor substrate.

For example, Japanese Patent No. 3186941 (published on Aug. 20, 1996) (Patent Document 1) discloses forming a through hole that extends from the rear surface of a semiconductor substrate to the electrode formed on the front surface of the semiconductor substrate, covering the inner wall of the through hole with an insulating film, and then filling the through hole with metal to form a feedthrough electrode. The feedthrough electrode forms a bump that projects from the rear surface of the semiconductor substrate. The publication also discloses a multi-chip module that intends to increase packaging density by stacking a plurality of semiconductor chips having such feedthrough electrodes.

Japanese Laid-Open Patent Publication No. 309221/2003 (Tokukai 2003-309221; published on Oct. 31, 2003) (Patent Document 2) discloses a fabrication method of a BGA (Ball Grid Array) semiconductor device including a feedthrough electrode. In this publication, a through hole is formed that extends from the rear surface of the semiconductor substrate to the electrode formed on the front surface of the semiconductor substrate. Then, after forming an oxide film oh the inner wall of the through hole and the rear surface of the electrode by CVD, anisotropic etching is performed to etch away only the oxide film adhered to the rear surface of the electrode, leaving the oxide film on the side wall. Thereafter, a metal layer is formed inside the through hole, so as to form a feedthrough electrode that connects the front and rear surfaces of the semiconductor substrate.

However, the conventional techniques of forming a feedthrough electrode have problems as described below. Before going into details, the following first describes an exemplary structure of the semiconductor device including a feedthrough electrode, with reference to FIG. 11.

Figure 11:
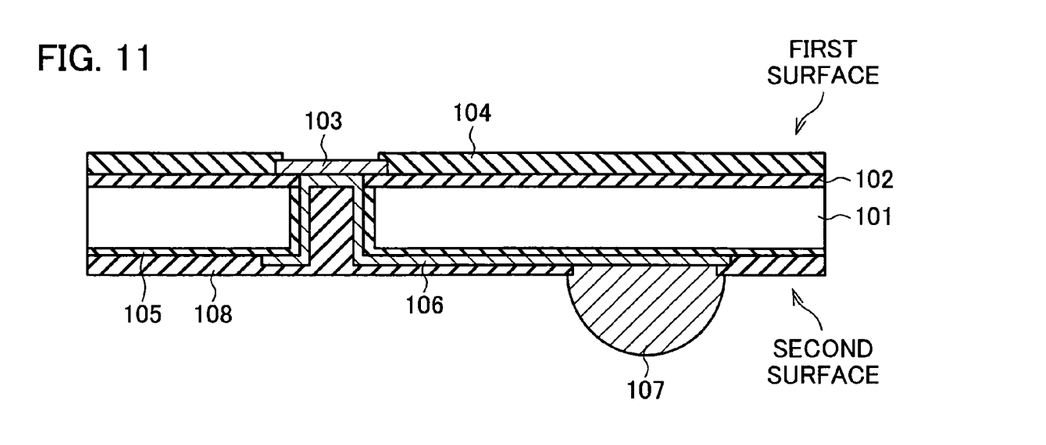
FIG. 11 is a cross sectional view illustrating a structure of a relevant portion of a conventional semiconductor device.

FIG. 11 is a cross sectional view illustrating a structure in the vicinity of an electrode formed in the semiconductor device including a feedthrough electrode. Generally, a first insulating film 102 is formed on a first surface (corresponding to the front surface) of a semiconductor substrate 101, and a multi-layered metal lead layer is formed on the first insulating film 102. The metal lead layer has an electrode pad 103 for sending signals in and out of the semiconductor chip, and the feedthrough electrode is formed in the area where the electrode pad 103 is formed. On the metal lead layer, a protecting film 104 such as an oxide film or a nitride film is formed.

In the semiconductor substrate 101, the through hole is formed directly below the electrode pad 103, and a second insulating film 105 is formed so as to cover the inner wall of the through hole and a second surface (corresponding to the rear surface) of the semiconductor substrate 101. Further, a conductive layer 106 is formed inside the through hole and on the second surface of the semiconductor substrate 101. The conductive layer 106 formed inside the through hole serves as the feedthrough electrode. The second surface of the semiconductor substrate 101 is connected to an external input/output terminal 107, and a protecting film 108 covers the second surface of the semiconductor substrate 101 except for a portion where the external input/output terminal 107 is formed. In this way, the conductive layer 106 connects the electrode pad 103, formed on the first surface of the semiconductor substrate 101, to the external input/output terminal 107, formed on the second surface of the semiconductor substrate 101.

In fabricating the semiconductor device of the structure shown in FIG. 11, the second insulating film 105 is formed, for example, by a CVD (Chemical Vapor Deposition) method from the second surface side of the semiconductor substrate 101 having been formed with the first insulating film 102, the electrode pad 103, and the protecting film 104.

Figure 12:
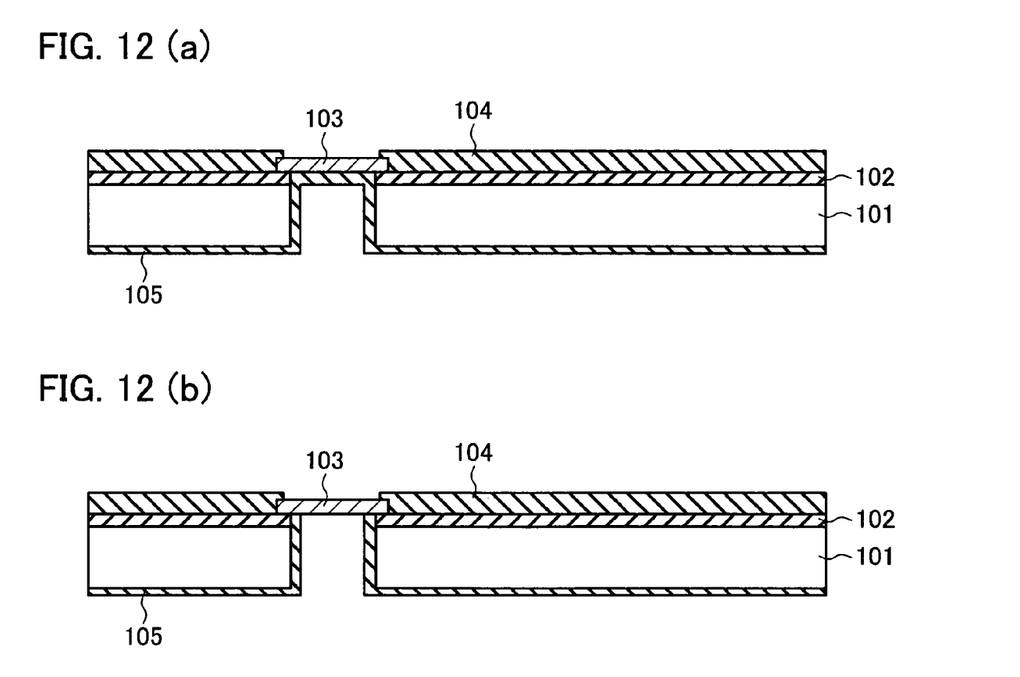
FIG. 12(a) and FIG. 12(b) are cross sectional views showing fabrication steps of a second insulating film of the conventional semiconductor device.

However, in this case, the second insulating film 105 is undesirably formed on the rear surface of the electrode pad 103 which needs to be conducted to the feedthrough electrode, as shown in FIG. 12(a). Therefore, before forming the conductive layer 106, it is required to remove the second insulating film 105 formed on the rear surface of the electrode pad 103, without removing the second insulating film 105 formed on the inner wall of the through hole, as shown in FIG. 12(b). There are several techniques of removing the second insulating film 105 formed on the rear surface of the electrode pad 103.

In the first technique, a resist is applied on the rear surface of the semiconductor substrate, and the resist inside the through hole is removed by photolithography. The insulating film on the rear surface of the electrode pad is then etched away by dry etching.

The second technique employs anisotropic dry etching, whereby the insulating film on the rear surface of the electrode is etched without etching the insulating film formed on the side wall of the through hole. The foregoing Patent Document 1 employs this technique.

A problem of the first technique is the difficulty in uniformly filling the through hole with the resist when the resist is uniformly applied over the rear surface of the semiconductor substrate formed with the though hole. With finer feedthrough electrodes, it becomes extremely difficult to fill the through hole with the resist and remove the resist inside the through hole by development.

As a rule, the electrode used for the semiconductor device is no greater than 100 µm². When a Si wafer is used as the semiconductor substrate for example, the wafer is generally used in a thickness of 100 µm to 700 µm. For example, with a 100 µm thick Si wafer with 70 µm² through holes, the resist cannot be easily applied uniformly inside the through holes. With finer electrodes as small as 10 µm in diameter and 50 µm in depth, the difficulty multiplies.

Even when it is possible to uniformly fill the through holes of such minute dimensions with the resist, it is still difficult to remove the resist by development because, with such an aspect ratio, the developer has a trouble circulating inside the through holes.

With the second technique, the insulating film on the rear surface of the electrode pad can be removed more easily compared with the first technique.

However, with the second insulating film formed by depositing an oxide film inside the through hole by CVD, the thickness of the insulating film becomes thinner on the inner wall of the through hole than on the rear surface of the semiconductor substrate. Further, in etching the insulating film on the rear surface of the electrode pad by anisotropic etching, the insulating film on the rear surface of the semiconductor substrate is also etched because the etching rate is faster for the insulating film on the rear surface of the semiconductor substrate than for the insulating film on the rear surface of the electrode pad at the bottom of the through hole. Further, despite that the etching is anisotropic, some reduction of the insulating film on the inner wall of the through hole cannot be avoided.

Another drawback of the second technique is that the through hole formed in the semiconductor substrate needs to be tapered so as to more easily perform the post steps of the second insulating film etching, i.e., the step of forming a metal film for forming a conductor in the through hole, or the step of filling the through hole with the conductor. The tapered through hole causes more etching reduction of the second insulating film on the inner wall of the through hole.

The problem of the second technique, then, is that it cannot provide enough thickness for the second insulating film formed on the inner wall of the through hole, or in some cases completely removes the second insulating film. That is, reliability of the feedthrough electrode suffers.

The reliability problem caused by the thickness reduction of the insulating film on the rear surface of the semiconductor substrate can be avoided by forming an insulating film of a suitable thickness on the rear surface of the semiconductor substrate in advance, or by forming another insulating film on the rear surface of the semiconductor substrate after the insulating film on the rear surface of the electrode pad has been etched away. However, both of these techniques increase fabrication cost. Further, the techniques are not effective for the reliability problem caused by the thickness reduction of the second insulating film formed on the inner wall of the through hole.

SUMMARY OF THE INVENTION

The present invention was made in view of the foregoing problems, and an object of the invention is to provide a feedthrough electrode that is highly reliable and can easily be fabricated at low cost.

In order to achieve the foregoing object, the present invention provides a fabrication method of a semiconductor device which includes: an electrode pad formed on a first surface of a semiconductor substrate via a first insulating film made of an inorganic material; and a feedthrough electrode for connecting the electrode pad to an external connection terminal formed on a second surface of the semiconductor substrate, the method including the steps of: (1) forming a second insulating film of an inorganic material on the second surface of the semiconductor substrate whose first surface has been formed with the first insulating film and the electrode pad, and opening the second insulating film directly below the electrode pad; (2) forming a through hole, using the second insulating film as a mask, that reaches the first insulating film through the semiconductor substrate and recedes from an opening edge of the second insulating film; (3) forming a third insulating film of an organic material on an inner wall of the through hole; (4) etching the first insulating film, using the second insulating film as a mask, so as to expose a rear surface of the electrode pad to a second surface side of the semiconductor substrate; and (5) forming a conductor that serves as the feedthrough electrode in the through hole and connects the electrode pad to the external connection terminal.

With this arrangement, the conductor for connecting the electrode pad formed on the first surface to the external input/output terminal formed on the second surface is insulated from the semiconductor substrate by the first through third insulating films.

The third insulating film is formed on the inner wall of the through hole formed in steps (1) and (2). By using the second insulating film as a mask, the through hole is formed to recede from the opening edge of the second insulating film (portions of the second insulating film form a canopy for the through hole). Thus, in step (3), the third insulating film is formed under the canopy of the second insulating film.

In step (4), the first insulating film is etched using the second insulating film as a mask, so as to expose the rear surface of the electrode pad to the second surface side of the semiconductor substrate. This can be carried out without a conventionally required photolithography step, which involves coating and development of a resist on the fine through holes in order to remove the insulating film unnecessarily formed on the rear surface of the electrode pad. Further, the method does not require a vacuum process, such as multiple rounds of CVD, which adds to the cost.

The first and second insulating films are made of inorganic material, and the third insulating film is made of organic material. In this way, the third insulating film formed on the inner wall of the through hole does not easily undergo thickness reduction by the etching of the first insulating film in step (4). That is, reliability does not suffer.

Further, with the third insulating film made of organic material, generated stress due to a difference in the coefficient of thermal expansion from the semiconductor substrate and the conductor formed in the through hole can be absorbed, and damage to the feedthrough electrode can be prevented.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) through FIG. 2(d) are cross sectional views showing steps of a fabrication process of the semiconductor device.

FIG. 3(a) through FIG. 3(d) are cross sectional views showing steps of the fabrication process of the semiconductor device.

FIG. 9(a) through FIG. 9(c) are cross sectional views showing steps of a fabrication process of the CCD package.

DESCRIPTION OF THE EMBODIMENTS

Referring to the attached drawings, the following will describe one embodiment of the present invention. First, a semiconductor device according to one embodiment of the invention is described with reference to FIG. 1, which illustrates a cross sectional structure in the vicinity of an electrode region of a semiconductor device provided with a feedthrough electrode.

Figure 1:
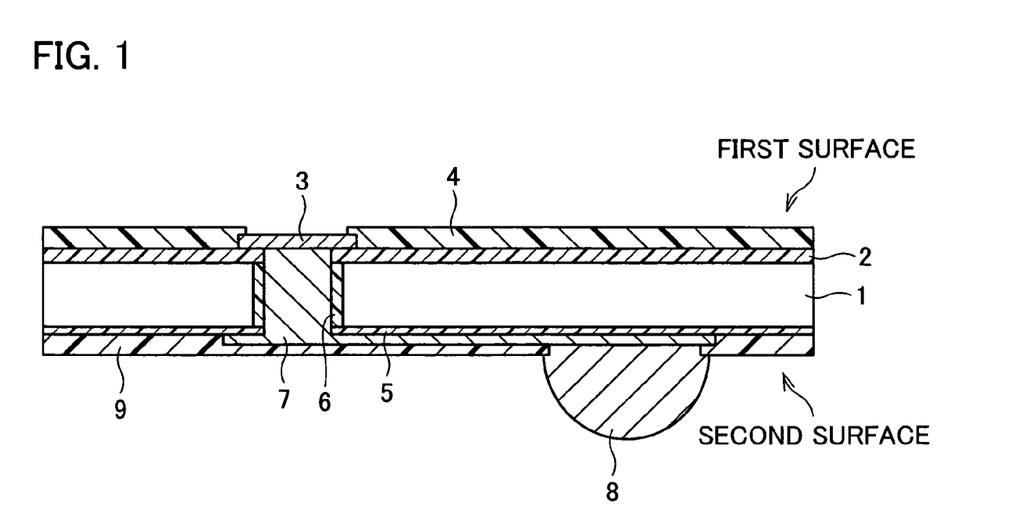
FIG. 1 is a cross sectional view showing a structure of a relevant portion of a semiconductor device according to one embodiment of the present invention.

The semiconductor device shown in FIG. 1 is structured to include a single- or multi-layered metal lead layer (usually multi-layered) on a first surface (corresponding to the front surface) of a semiconductor substrate (for example, Si wafer) 1 via a first insulating film 2. A semiconductor element (not shown) is connected to a predetermined terminal formed on the metal lead layer, and an electrode pad 3 is provided for signal input and output in and out of the semiconductor element. In FIG. 1, only the electrode pad 3 is shown in the metal lead layer. On the metal lead layer, there is provided a protecting film 4 formed of an oxide film or a nitride film. As the semiconductor substrate 1, a non-Si substrate, for example, such as a GaAs substrate may be used. The first insulating film 2 is made of an inorganic material. For example, an oxide film such as a silicon oxide film can be used therefor.

In the semiconductor device, the feedthrough electrode is formed in the area of the electrode pad 3. Therefore, in the semiconductor substrate 1, a through hole is provided directly below the electrode pad 3. A third insulating film 6 is formed to cover the inner wall of the through hole, and a second insulating film 5 is formed to cover a second surface (corresponding to the rear surface) of the semiconductor substrate 1. As with the first insulating film 2, the second insulating film 5 is made of an inorganic material. For example, SiN or an oxide film such as a silicon oxide film can be used. The third insulating film 6 is made of an organic material.

A conductor 7 is formed over the inner wall of the through hole and a portion of the second surface of the semiconductor substrate 1. The conductor 7 on the inner wall of the through hole serves as the feedthrough electrode. The electrode pad 3 and the conductor 7 are insulated from the semiconductor substrate 1 by the first insulating film 2, the second insulating film 5, and the third insulating film 6.

The conductor 7 on the second surface of the semiconductor substrate 1 is connected to an external input/output terminal 8, and the second surface of the semiconductor substrate 1 is covered with a protecting film 9 except where the external input/output terminal 8 is formed. In this way, the electrode pad 3 formed on the first surface of the semiconductor substrate 1 can conduct, via the conductor 7, to the external input/output terminal 8 formed on the second surface of the semiconductor substrate 1.

Referring to FIGS. 2(a) through 2(d) and FIGS. 3(a) through 3(d), the following describes a process of forming the feedthrough electrode in the semiconductor device shown in FIG. 1.

FIG. 2(a) schematizes a cross sectional structure in a portion of the semiconductor substrate 1 where the electrode pad 3 is formed, illustrating a state in which the first insulating film 2, the metal lead layer including the electrode pad 3, and the protecting film 4 have been formed on the first surface of the semiconductor substrate 1.

In the state illustrated in FIG. 2(a), the rear surface of the semiconductor substrate 1 has been ground to provide a predetermined thickness. This is for cost consideration and controllability of the hole shape; that is, to prevent cost increase and difficulty in controlling the hole shape, which are caused when the etching time is increased by an increased thickness (deep through hole) of the semiconductor substrate 1 in forming the though hole in a subsequent fabrication step. Specifically, the thickness of the semiconductor substrate 1 is reduced to such an extent as to restrain the depth of etching. In the present embodiment, the thickness of the semiconductor substrate 1 is set to 300 μm because, if the thickness is too thin, handling of the semiconductor substrate 1 becomes difficult and the risk of breakage and bowing increases in later steps.

Thereafter, in order to form the second insulating film 5, an oxide film of 2 μm thick is formed on the ground rear surface (second surface) of the semiconductor substrate 1 by the CVD method. Here, the second insulating film 5 needs to be thicker than the first insulating film 2 because the second insulating film 5 serves as a mask when the first insulating film 2 is etched in a later step. Then, with a resist 11 applied over the second insulating film 5, the resist 11 is exposed and developed in such a manner as to expose an area of the first surface corresponding to the electrode pad 3. In this way, the resist 11 serves as a mask for the dry etching of the second insulating film 5. This is illustrated in FIG. 2(a).

By the dry etching of the second insulating film 5 using the resist 11 as a mask, a portion of the second insulating film 5 is removed, as shown in FIG. 2(b).

Next, after removing the resist 11, the semiconductor substrate 1, or Si, is etched by RIE, using the second insulating film 5 as a mask, as shown in FIG. 2(c). The semiconductor substrate 1 is etched until the first insulating film 2 directly below the electrode pad 3 is exposed. Here, etching of the semiconductor substrate 1 is performed by RIE, which is an anisotropic etching method. However, by controlling etching conditions, etching may be performed in such a manner that the semiconductor substrate 1 recedes from the opening edge of the second insulating film 5.

Specifically, this can be performed according to the following techniques.

Figure 4:
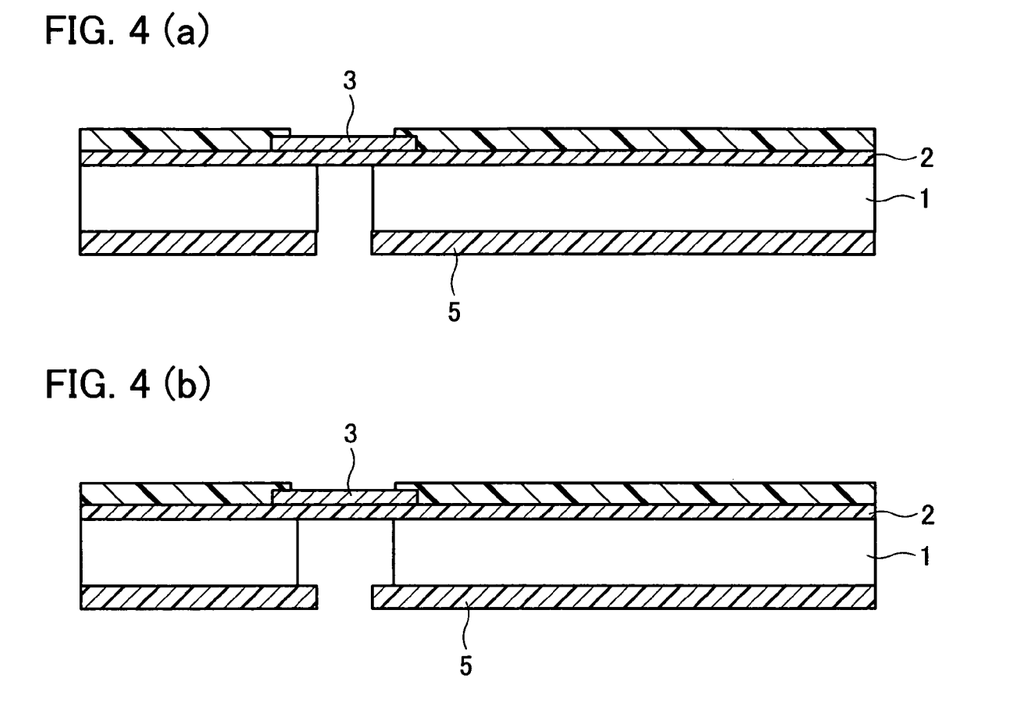
FIG. 4(a) and FIG. 4(b) are cross sectional views illustrating an example of fabrication steps in which a through hole is formed in the semiconductor substrate of the semiconductor device.

For example, as illustrated in FIG. 4(a), the semiconductor substrate 1 is first etched by anisotropic etching such as RIE until the first insulating film 2 is exposed. This is followed by isotropic etching whereby the semiconductor substrate 1 recedes from the opening edge of the second insulating film 5, as shown in FIG. 4(*b*).

Figure 5:
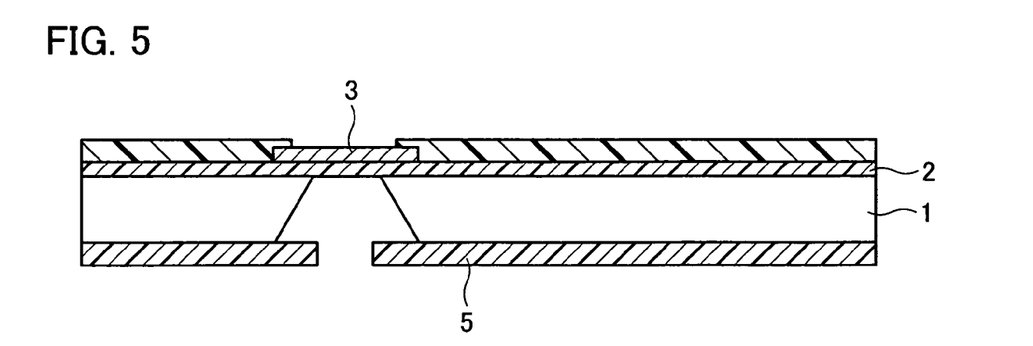
FIG. 5 is a cross sectional view illustrating another example of fabrication steps in which a through hole is formed in the semiconductor substrate of the semiconductor device.

Alternatively, by using the second insulating film 5 as a mask, a tapered through hole is formed by wet etching using chemicals such as TMAH, so as to cause the semiconductor substrate 1 to recede from the opening edge of the second insulating film 5, as shown in FIG. 5.

Further, by combining these two techniques, the semiconductor substrate 1 is first etched by anisotropic etching such as RIE until the first insulating film 2 is exposed, and then caused to recede by wet etching.

Figure 2:
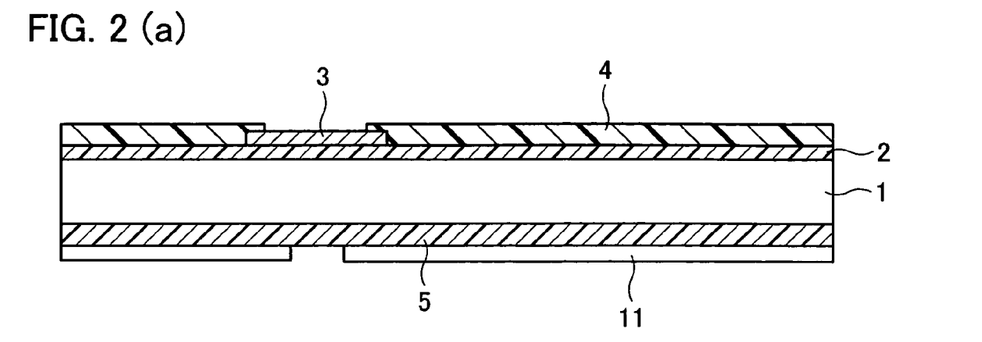

With the through hole formed in the semiconductor substrate 1, electrodeposition is performed using the semiconductor substrate 1, or Si, as a cathode, so as to form an electrodeposition resist 6' in the Si exposed portion on the inner wall of the through hole, as shown in FIG. 2(*d*). As a material of the electrodeposition resist 6', polyimide or epoxy may be used for example. Here, if the electrode pad 3, electrically in contact with the semiconductor substrate 1, is exposed to the electrodeposition solution, the electrodeposition resist is undesirably formed on the exposed portion. It is therefore required that the surface of the semiconductor substrate 1 be coated in advance with another resist or a protecting film. Alternatively, a device of such a structure needs to be used that does not allow the electrodeposition solution to invade the surface of the semiconductor substrate 1.

The electrodeposition resist 6' is formed on the conducting portion, i.e., the exposed surface of the semiconductor substrate 1 serving as a cathode. Thus, the electrodeposition resist 6' deposits on the inner wall of the through hole of the semiconductor substrate 1, but not on the rear surface of the first insulating film 2 directly below the electrode pad 3. However, in actual practice, some growth of the electrodeposition resist 6' may be observed on the second surface of the semiconductor substrate 1, as shown in FIG. 2(*d*).

The state shown in FIG. 2(*d*) is the result of electrodeposition carried out to a predetermined thickness using a commercially available electrodeposition solution, and subsequent washing and curing. Here, the electrodeposition is performed to a thickness of about 15 μm, taking into account a possible thickness reduction of the electrodeposition resist at the shoulder of the pinhole or through hole.

Note that, the insulating film on the inner wall of the through hole formed in the semiconductor substrate 1 can also be formed by CVD using an inorganic material such as an oxide film. However, forming an inorganic insulating film with a 10 μm or greater thickness is problematic in that it is time consuming and expensive, in addition to causing cracking or detaching. Such problems associated with formation of the insulating film on the inner wall of the semiconductor substrate 1 can be avoided by the electrodeposition of the organic film, because it allows the thickness to be easily controlled. Further, since the electrodeposition resist 6' is formed only on the exposed surface of the semiconductor substrate 1 serving as a cathode, the inner wall of the through hole in the semiconductor substrate 1 can easily be insulated without requiring an additional process such as patterning.

Thereafter, as shown in FIG. 3(*a*), the electrodeposition resist 6' is subjected to anisotropic dry etching using the second insulating film 5 as a mask, so as to form the third insulating film 6 only on the inner wall of the through hole of the semiconductor substrate 1. Referring back to FIG. 2(*d*), the receding of the semiconductor substrate 1 from the opening edge of the second insulating film 5 leaves a canopy in portions of the second insulating film 5. In the etching, the canopy serves as a mask to prevent the third insulating film 6 formed on the inner wall of the through hole from being removed. By the anisotropic dry etching, the opening edge of the second insulating film 5 and the inner periphery surface of the third insulating film 6 coincide as viewed from the second surface side of the semiconductor substrate 1.

Figure 3A:
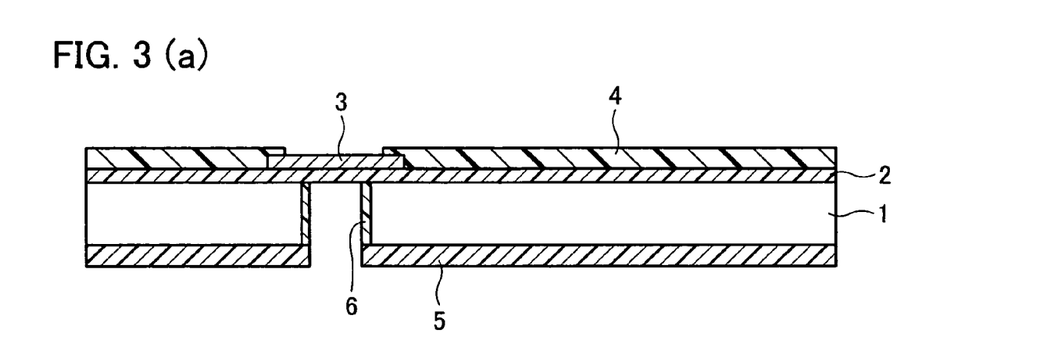

Since the third insulating film 6 is formed by electrodeposition, it can easily be formed even in the presence of the canopy. Further, unlike the conventional CVD using an inorganic material, there will be no defects associated with a reduced thickness underneath the canopy, or failed insulation due to poor coverage. Further, even when the second insulating film 5 or a portion of the first insulating film 2 exposed inside the through hole has a small amount of electrodeposition resist 6' adhered to it, such electrodeposition resist 6' can be removed by the anisotropic etching using the second insulating film 5 as a mask.

As described above, the electrodeposition resist 6' is formed with a certain margin, and the third insulating film 6 is formed by anisotropic dry etching. However, under suitably controlled electrodeposition conditions, only the electrodeposition can be used to form the third insulating film 6 in the ideal configuration shown in FIG. 3(*a*). In this case, the anisotropic dry etching for removing unnecessary electrodeposition resist 6' can be omitted.

Next, as shown in FIG. 3(*b*), the rear surface of the electrode pad 3 is exposed by dry etching the first insulating film 2 directly below the electrode pad 3, using the second insulating film 5 as a mask. Here, because the second insulating film 5 is used as a mask for the etching of the first insulating film 2 on the rear surface of the electrode pad 3, no additional process of forming a mask is required. Specifically, the method does not require applying and patterning the resist on the semiconductor substrate 1 formed with the through hole, nor does it require forming the insulating film by multiple rounds of CVD. That is, the method does not involve any alignment procedure, and therefore enables the electrode pad 3 to be readily exposed.

Figure 3B:
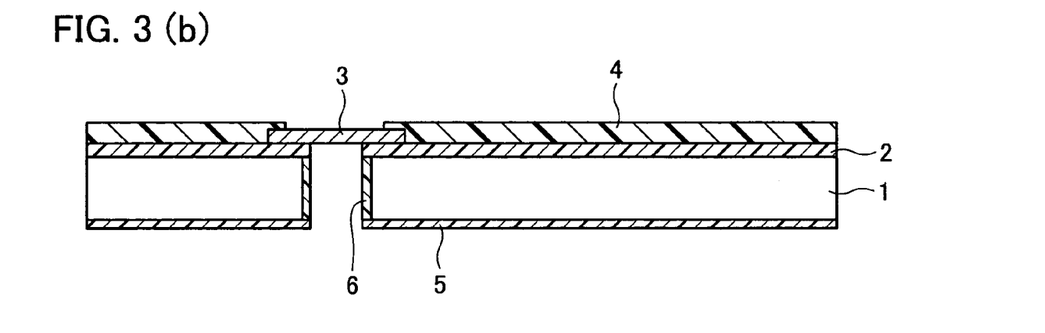

As to the selective ratio of the first insulating film 2 made of inorganic material to the third insulating film 6 made of organic material, a large selective ratio can be provided. Further, the third insulating film 6 can have a much greater thickness than the first insulating film 2. Thus, the etching of the first insulating film 2 does not lead to reduction or removal of the third insulating film 6. Further, there is no risk of generating pin holes in the etching. As a result, the inner wall of the through hole can be insulated highly reliably.

Thereafter, as shown in FIG. 3(*c*), a seed metal layer 7a for electrolytic plating is formed by CVD from the rear surface side of the semiconductor substrate 1. The seed metal layer 7a may be formed by a method other than CVD, for example, such as sputtering. Here, because the seed metal layer 7a needs to be formed also inside the through hole of a certain depth, the method employs the CVD method which allows the film to be formed even in a narrow space. As the seed metal layer 7a, TiN and Cu are formed to 0.1 μm and 0.5 μm, respectively, for example.

Figure 3C:
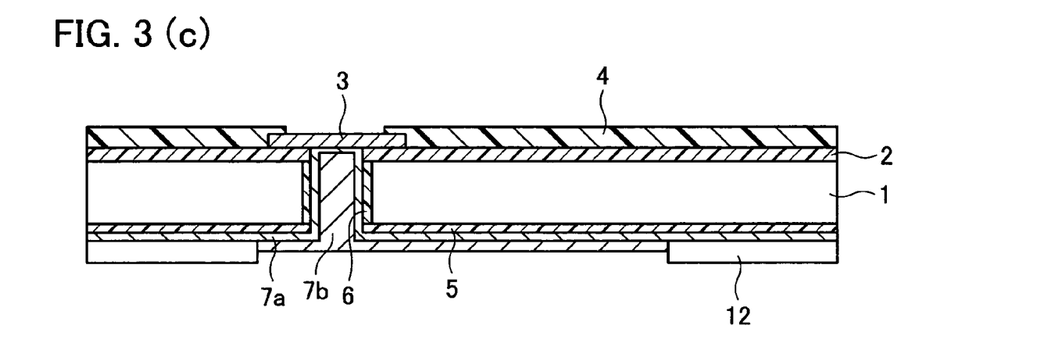

Next, a conductive layer 7b is formed to provide a re-wiring pattern for electrically connecting the rear surface of the electrode pad 3 to the external input/output terminal 8 to be fabricated later. The conductive layer 7b is formed on the seed metal layer 7a by, for example, electrolytic Cu plating in the manner described below. First, a resist 12 is applied onto the rear surface of the semiconductor substrate 1, and the resist 12 is patterned to provide a re-wiring pattern by a common photolithography technique employing exposure and development. Note that, in the case where it is difficult to apply a liquid resist on the semiconductor substrate 1 formed with the through hole, a dry film resist may be used as the resist 12.

Thereafter, electrolytic Cu plating is performed using the seed metal layer 7a as a cathode. The electrolytic Cu plating increases the thickness of the re-wiring pattern in the opening of the resist 12, and thereby forms the conductive layer 7b. The thickness of the conductive layer 7b was set to 10 µm, in order to mount a solder ball as the external input/output terminal 8 in a later step.

Figure 3D:
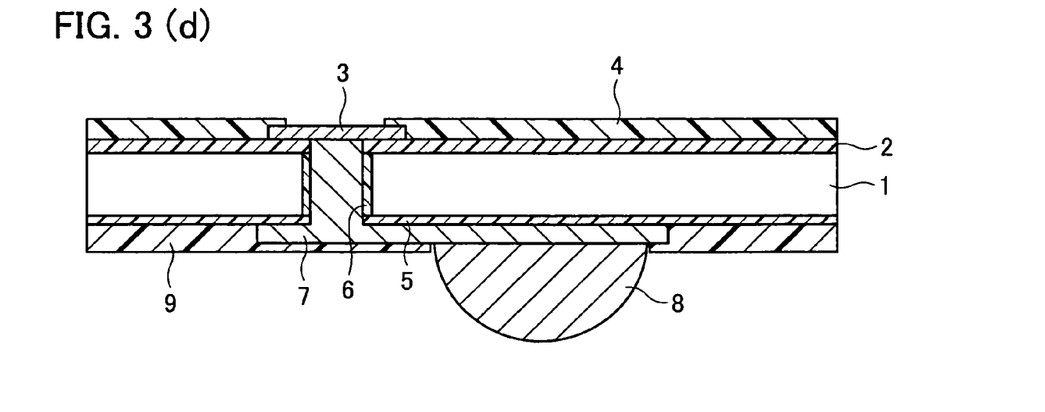

After the electrolytic plating, the resist 12 is removed and the seed metal layer 7a is etched away, as shown in FIG. 3(d). As a result, the seed metal layer 7a and the conductive layer 7b are formed into the conductor 7, as shown in FIG. 3(d). Then, the protective film 9 is formed by coating the entire rear surface of the semiconductor substrate 1 with a photosensitive insulating resin. A portion of the protecting film 9 where the external input/output terminal 8 is formed is then removed by photolithography involving exposure and development. Thereafter, a solder ball serving as the external input/output terminal 8 is mounted in the opening of the protecting film 9, and the device is diced into individual semiconductor chips to finish the fabrication of the semiconductor device shown in FIG. 1.

The product semiconductor device was proven to be highly reliable by a temperature cycle test. Generally, the semiconductor substrate and the conductor (feedthrough electrode) filled in the through hole of the semiconductor substrate have different coefficients of thermal expansion, and therefore the semiconductor substrate and the feedthrough electrode are subjected to stress when there is a temperature change. The stress may cause cracking in portions of the semiconductor substrate around the feedthrough electrode, or in the insulating inner wall when it is made of an inorganic material.

In order to avoid such a problem, the semiconductor device according to one embodiment of the present invention is adapted to use an organic material for the third insulating film 6 constituting the insulating inner wall of the through hole. Since the organic material is softer and more flexible compared with conventionally used inorganic materials, it is less susceptible to cracking and therefore improves reliability of the feedthrough electrode.

The semiconductor device with the structure according to one embodiment of the present invention can maintain high connection reliability even when it is stacked to provide a stacked semiconductor device.

Figure 6:
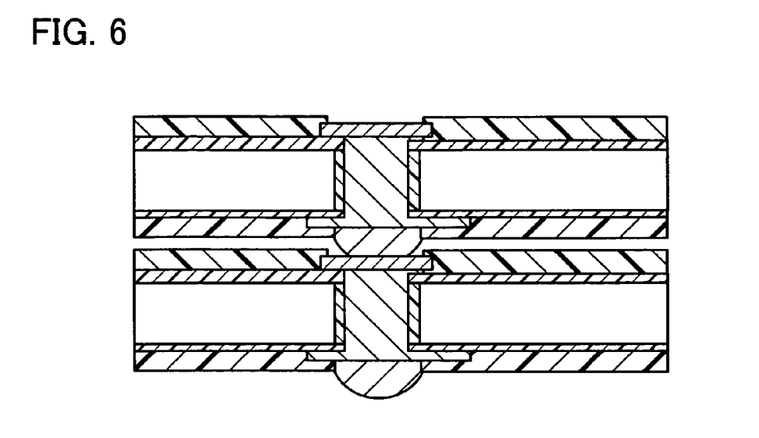
FIG. 6 is a cross sectional view illustrating an example of a stacked structure of semiconductor devices connected to one another via the feedthrough electrodes.

Referring to FIG. 6, when semiconductor devices are stacked by connecting the feedthrough electrodes, the stress acts vertically on the feedthrough electrodes. In order to overcome such stress, the semiconductor device according to one embodiment of the present invention is adapted use an organic material for the third insulating film 6 constituting the insulating inner wall of the through hole. Since the organic material is softer and more flexible compared with conventionally used inorganic materials, it is less susceptible to cracking and therefore maintains connection reliability of the stacked semiconductor devices.

In the fabrication steps of FIG. 2(d) to FIG. 3(a), the organic insulating material used to form the third insulating film 6 on the inner wall of the through hole of the semiconductor substrate 1 is formed by the electrodeposition method. However, in the present invention, the method of forming the organic insulating material on the inner wall of the through hole is not particularly limited. For example, a printing method illustrated in FIGS. 7(a) and 7(b) may be used as well.

Figure 7:
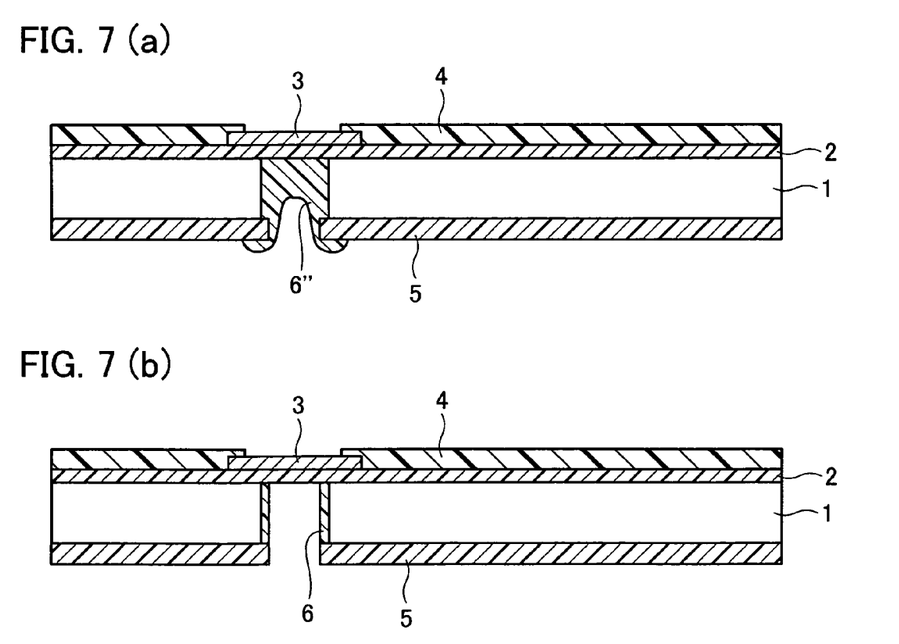
FIG. 7(a) and FIG. 7(b) are cross sectional views illustrating an example of fabrication steps of a third insulating film in the semiconductor device.

FIG. 7(a) shows a state in which a through hole has been formed in the semiconductor substrate 1, and the semiconductor substrate 1 in the through hole has receded from the opening edge of the second insulating film 5, as in FIG. 2(c). Inside the through hole of the semiconductor substrate 1, an organic insulating material 6" to be the third insulating film 6 is formed by a printing method. As the printing method, common screen printing may be used. Specifically, a screen mask having an opening corresponding to the through hole of the semiconductor substrate 1 is used, and a liquid organic insulating material is spread into the through hole with a squeegee.

As the organic insulating material 6", various organic insulating materials such as epoxy or polyimide can be used. After the printing, the organic insulating material 6" is cured. FIG. 7(a) shows the state after the printing. Note that, for the implant printing of the organic insulating material 6", use of a vacuum printing method provides better results.

Thereafter, as shown in FIG. 7(b), anisotropic dry etching is performed using the second insulating film 5 as a mask, so as to remove unnecessary portions of the organic insulating material 6". As a result, the third insulating film 6 is formed and the first insulating film 2 is exposed. The state illustrated in FIG. 7(b) is the same as FIG. 3(a). As such, as to the subsequent steps, the procedures of FIGS. 3(b) through 3(d) can be followed to fabricate the semiconductor device.

Figure 8:
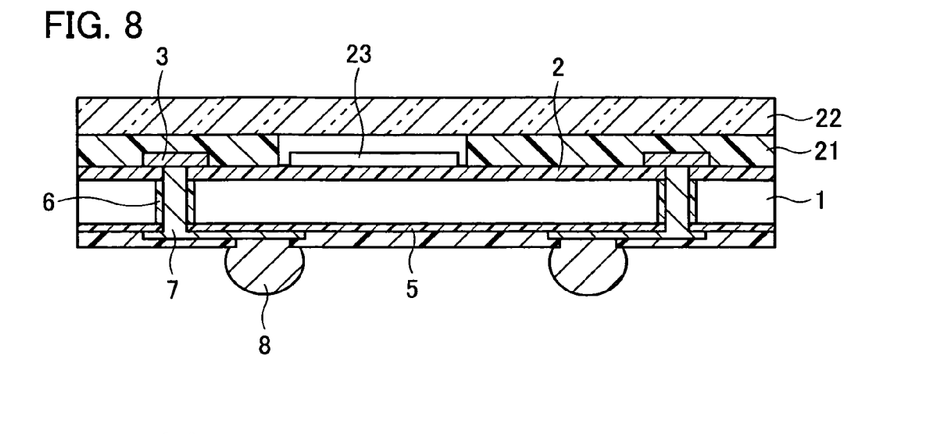
FIG. 8 is a cross sectional view showing a structure of a relevant portion of a CCD package using the semiconductor device.

Referring to FIG. 8, the following will describe an exemplary structure of a CCD (Charge Coupled Device) package using a semiconductor device with a feedthrough electrode according to the present invention. In FIG. 8, constituting elements structurally and functionally the same as those described in conjunction with the semiconductor device of FIG. 1 will be described by referring to the same reference numerals.

In the CCD package shown in FIG. 8, the through hole is formed directly below the electrode pad 3 formed on the first surface of the semiconductor substrate 1, and the electrode pad 3 formed on the first surface of the semiconductor substrate 1 and the external input/output terminal 8 formed on the second surface of the semiconductor substrate 1 are electrically connected to each other via the conductor 7 formed by Cu plating.

The semiconductor substrate 1 is electrically insulated from the electrode pad 3 and the conductor 7. The insulation is provided by the first insulating film 2 formed on the first surface of the semiconductor substrate 1, the second insulating film 5 formed on the second surface of the semiconductor substrate 1, and the third insulating film 6 formed on the inner wall of the through hole.

On the first surface of the semiconductor substrate 1, a glass plate 22 is bonded via an adhesive 21. The adhesive 21 is formed in such a manner as to avoid a CCD sensor unit 23 formed on the first surface of the semiconductor substrate 1.

Referring to FIGS. 9(a) through 9(c) and FIGS. 10(a) and 10(b), the following will describe an exemplary fabrication process of the CCD package. Generally, a multi-layered insulating film is formed on the first surface of the semiconductor substrate 1, and a multi-layered electrode pad 3 is formed thereon.

Figure 9:
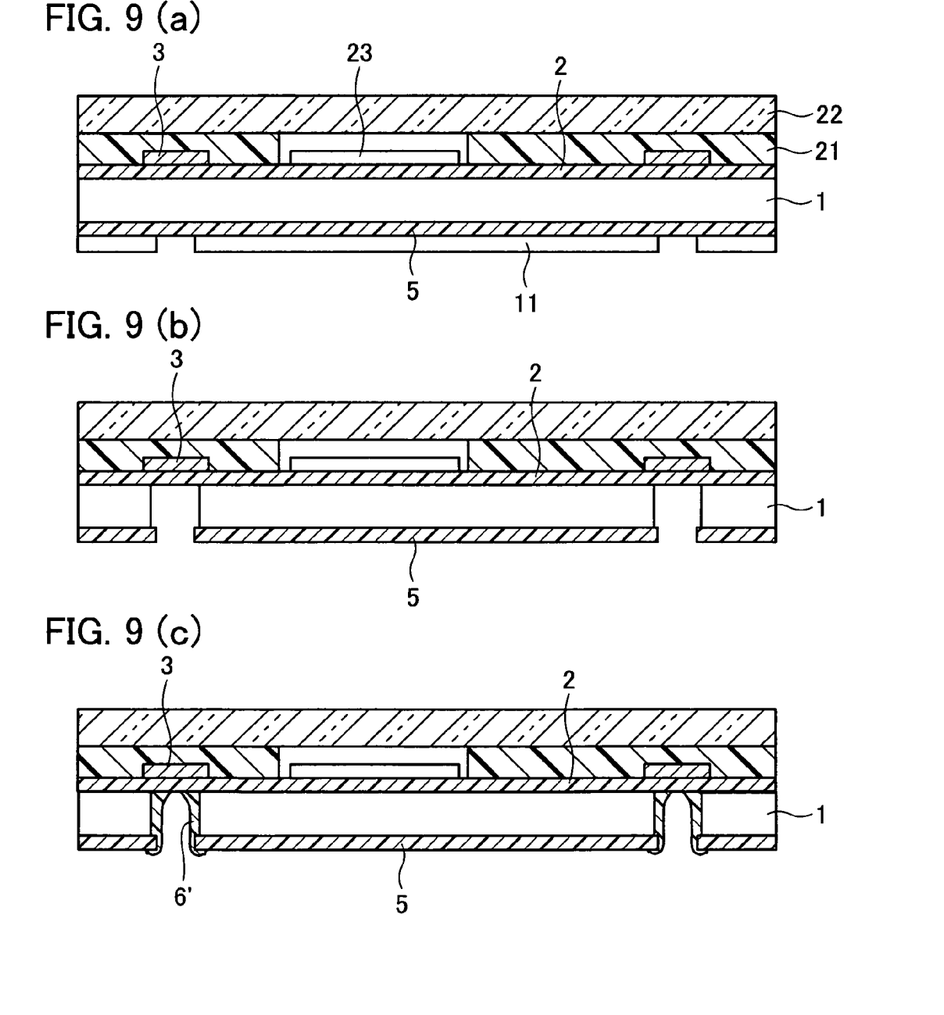

First, as illustrated in FIG. 9(a), a layer of adhesive 21 is formed on the first surface of the semiconductor substrate 1 where the first insulating film 2, the metal lead layer (including the electrode pad 3), and the CCD sensor unit 23 are formed. The adhesive 21 is formed in such a manner as to avoid the region where the CCD sensor unit 23 is formed. This is to avoid the CCD sensor unit 23 from being optically degraded by the adhesive 21. The adhesive 21 is formed on the semiconductor substrate 1 by a known technique such as a dispensing method or a printing method. Alternatively, the adhesive 21 may be formed on the glass plate 22 to be mated with the semiconductor substrate 1.

In order to protect the CCD sensor unit 23 provided with micro lenses and the like, the glass plate 22 is mated with the semiconductor substrate 1 via the adhesive 21 of a predetermined thickness. The glass plate 22 is used for the protection of the CCD sensor unit 23 and reinforcement of the semiconductor substrate 1 of the reduced thickness. Here, the glass plate 22 has a thickness of 0.5 mm.

Thereafter, the rear surface of the semiconductor substrate 1 is ground to a thickness of 100 µm. By reducing the thickness of the semiconductor substrate 1 as thin as possible, the thickness of the CCD package is reduced. It should be noted however that the adhesive 21 is not formed in the area where the CCD sensor unit 23 is provided, and therefore the semiconductor substrate 1 may be broken when its rear surface is ground to a certain thickness under this condition. Such a problem can be avoided by first grinding the rear surface of the semiconductor substrate 1 to a thickness of 100 µm or less using a common rear-surface grinding method, and then mating the semiconductor substrate 1 with the glass plate 22 formed with the adhesive 21.

Next, SiN to be the second insulating film 5 is formed on the ground rear surface of the semiconductor substrate 1 by a CVD method. After applying a resist 11 on the second insulating film 5, the resist 11 is exposed and developed to remove portions corresponding to the electrode pad 3 formed on the first surface of the semiconductor substrate 1. FIG. 9(a) shows this state.

Then, as shown in FIG. 9(b), the SiN forming the second insulating film 5 is dry etched to form openings, using the resist 11 as a mask. The resist 11 is then removed. Thereafter, using the second insulating film 5 as a mask, the Si forming the semiconductor substrate 1 is subjected to anisotropic dry etching. The semiconductor substrate 1 is etched until the first insulating film 2 directly below the electrode pad 3 is exposed. This is followed by isotropic dry etching, which causes the semiconductor substrate 1 to recede from the opening edge of the second insulating film 5.

Thereafter, as shown in FIG. 9(c), electrodeposition is performed using the semiconductor substrate 1 as a cathode, so as to form an electrodeposition resist (for example, electrodeposition polyimide) 6' on the inner wall of the through hole formed in the semiconductor substrate 1. The electrodeposition resist 6' is deposited to a predetermined thickness, and this is followed by washing and curing. FIG. 9(c) shows this state. The electrodeposition was performed to a thickness of about 10 µm, taking into account a possible thickness reduction of the electrodeposition resist 6' at the shoulder of the pinhole or Si opening. Since the electrodeposition resist 6' is formed only on the exposed surface of the semiconductor substrate 1 serving as a cathode, the inner wall of the semiconductor substrate 1 can easily be insulated without requiring an alignment or patterning process.

Figure 10:
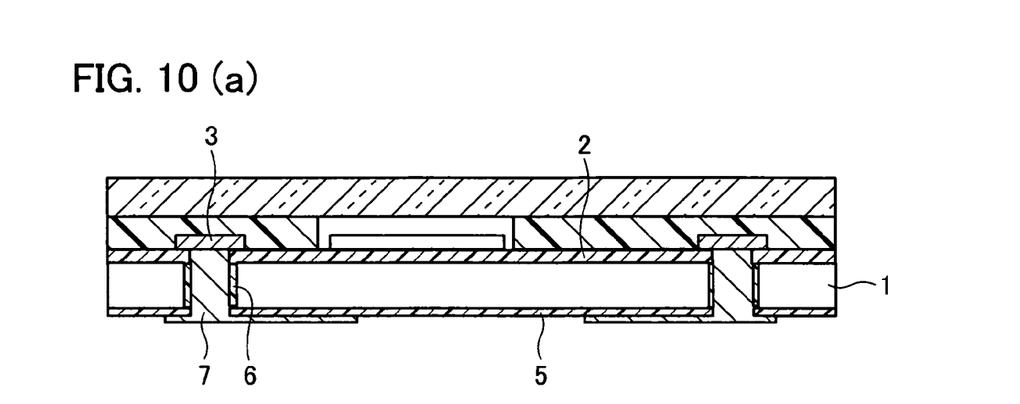
FIG. 10(a) and FIG. 10(b) are cross sectional views showing steps of the fabrication process of the CCD package.

Next, as shown in FIG. 10(a), the electrodeposition resist 6' is etched using the second insulating film 5 as a mask, so as to form the third insulating film 6. Here, by anisotropic etching such as RIE, the electrodeposition resist 6' adhered to the first insulating film 2 directly below the electrode pad 3 can be removed. Then, by using the second insulating film 5 as a mask, the first insulating film 2 directly below the electrode pad 3 is dry etched, so as to expose the electrode pad 3 in the through hole of the semiconductor substrate 1.

Thereafter, a seed metal layer for electrolytic plating is formed by sputtering from the rear surface side of the semiconductor substrate 1. The seed metal layer may be formed by a method other than sputtering, for example, such as vapor deposition or CVD. Here, reverse sputtering was performed at 0.5 kw for 5 minutes, and Ti and Cu were sputtered to 0.1 µm and 0.5 µm, respectively. Under these conditions, a metal film of about 0.2 µm to 0.3 µm thick was observed on the inner wall of the through hole of the semiconductor substrate 1.

Next, a conductive layer is formed to provide a re-wiring pattern for electrically connecting the rear surface of the electrode pad 3 to the external input/output terminal 8. The conductive layer is formed by electrolytic Cu plating in the manner described below. First, a resist is applied on the rear surface of the semiconductor substrate 1. In the case where it is difficult to apply a liquid resist on the semiconductor substrate 1 formed with the through hole, a dry film resist may be used. Then, the resist is patterned to provide a re-wiring pattern by a common photolithography technique employing exposure and development. This is flowed by electrolytic Cu plating using the seed metal layer as a cathode, so as to form the conductive layer. The seed metal layer and the conductive layer constitute the conductor 7. The thickness of the conductive layer was set to 10 µm, in order to mount a solder ball as the input/output terminal in a later step. After the electrolytic plating, the resist is removed and unnecessary portions of the seed metal layer are etched away. FIG. 10(a) shows this state.

The conductive layer formed by electrolytic plating to provide the rewiring pattern may be realized by a wiring formed by pattern printing of a conductive paste. Alternatively, other methods, for example, such as vapor deposition and sputtering of metal, followed by pattern etching may be used as well. For example, the conductive layer can be formed by wet etching a resist pattern formed by sputtering Ti and a CuNi alloy to 0.2 µm and 0.6 µm, respectively.

Then, as shown in FIG. 10(b), the protective film 9 is formed by coating the entire rear surface of the semiconductor substrate 1 with a photosensitive insulating resin, and then by removing portions where the solder ball serving as the external input/output terminal 8 is mounted. Thereafter, the solder ball serving as the external input/output terminal 8 is mounted in the opening of the protecting film 9, and the device is diced into individual semiconductor chips to finish the fabrication of the CCD package shown in FIG. 8.

The CCD package has the sensor unit on the surface, and therefore care must be taken not to damage the surface by staining or scratching. In the present invention, this is not a problem because the through hole is formed from the rear surface side of the semiconductor substrate. Further, since the product CCD package allows for connection by reflow soldering with the sensor unit facing upward, conventionally required wire bonding is not required. This enables a small and thin camera module to be realized.

As described above, that present invention provides a fabrication method of a semiconductor device which includes: an electrode pad formed on a first surface of a semiconductor substrate via a first insulating film made of an inorganic material; and a feedthrough electrode for connecting the electrode pad to an external connection terminal formed on a second surface of the semiconductor substrate, the method including the steps of: (1) forming a second insulating film of an inorganic material on the second surface of the semiconductor substrate whose first surface has been formed with the first insulating film and the electrode pad, and opening the second insulating film directly below the electrode pad; (2) forming a through hole, using the second insulating film as a mask, that reaches the first insulating film through the semiconductor substrate and recedes from an opening edge of the second insulating film; (3) forming a third insulating film of an organic material on an inner wall of the through hole; (4) etching the first insulating film, using the second insulating film as a mask, so as to expose a rear surface of the electrode pad to a second surface side of the semiconductor substrate; and (5) forming a conductor that serves as the feedthrough electrode in the through hole and connects the electrode pad to the external connection terminal.

The method may be adapted so that, in step (2), the semiconductor substrate is first subjected to anisotropic etching and then isotropic etching using the second insulating film as a mask, so as to cause the through hole to recede from the opening edge of the second insulating substrate.

The method may be adapted so that, in step (2), the semiconductor substrate is subjected to wet etching, so as to cause the through hole to recede from the opening edge of the second insulating film.

In the method, it is preferable that the second insulating film have such an etching selective ratio that exhibits a masking effect when etching the semiconductor substrate in step (2).

The method may be adapted so that, in step (3), the third insulating film is formed by electrodeposition using the semiconductor substrate as a cathode.

According to this arrangement, the third insulating film is formed by electrodeposition using the semiconductor substrate as a cathode. In this way, the third insulating film is formed only on the surface of the semiconductor substrate (i.e., inner wall of the through hole formed in the semiconductor substrate), and not on the rear surface of the electrode pad. Thus, the method does not require the step of removing the third insulating film formed on the rear surface of the electrode pad, and therefore realizes a feedthrough electrode that is highly reliable and can be fabricated at low cost.

The method may be adapted so that, in step (3), the third insulating film is formed by filling an organic insulating material in the through hole by a printing method, and then by performing anisotropic etching using the second insulating film as a mask.

In the method, it is preferable that, in step (3), the organic insulating material be filled in the through hole by a vacuum printing method.

In the method, it is preferable that the third insulating film be polyimide or epoxy.

In order to achieve the foregoing object, the present invention provides a semiconductor device including: an electrode pad formed on a first surface of a semiconductor substrate via a first insulating film made of an inorganic material; a feedthrough electrode for connecting the electrode pad to an external connection terminal formed on a second surface of the semiconductor substrate; a through hole formed directly below the electrode pad formed via the first insulating film on the first surface of the semiconductor substrate; a second insulating film formed on the second surface of the semiconductor substrate; and a third insulating film formed on an inner wall of the through hole, the second insulating film and the third insulating film being formed so that an opening edge of the second insulating film coincides with an inner periphery surface of the third insulating film as viewed from a second surface side of the semiconductor substrate.

According to this arrangement, the opening edge of the second insulating film coincides with the inner periphery surface of the third insulating film as viewed from the second surface side of the semiconductor substrate. This enables the second insulating film to be used as a mask in the etching performed to remove the first insulating film undesirably formed on the rear surface of the electrode pad. Thus, the method does not require a conventionally required photolithography step, which involves coating and development of a resist on the fine through holes. Further, the method does not require a vacuum process, such as multiple rounds of CVD, which adds to the cost.

A plurality of semiconductor devices may be stacked on one another.

The semiconductor device may be adapted to include a reinforcement plate, bonded on a first surface side of the semiconductor substrate via an adhesive layer, for preventing damage to the semiconductor substrate.

Further, the semiconductor device may be a solid-state image capturing device including: a reinforcement plate realized by a light transmissive member; and a CCD sensor disposed between the semiconductor substrate and the reinforcement plate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    an electrode pad formed on a first surface of a semiconductor substrate via a first insulating film made of an inorganic material;
    a feedthrough electrode for connecting the electrode pad to an external connection terminal formed on a second surface of the semiconductor substrate;
    a through hole formed directly below the electrode pad formed via the first insulating film on the first surface of the semiconductor substrate;
    a second insulating film formed on the second surface of the semiconductor substrate; and
    a third insulating film formed on an inner wall of the through hole,
    the second insulating film and the third insulating film being formed so that an opening edge of the second insulating film coincides with an inner periphery surface of the third insulating film as viewed from a second surface side of the semiconductor substrate.

2. A semiconductor device which comprises a plurality of semiconductor devices of claim 1 stacked on one another.

3. The semiconductor device as set forth in claim 1, comprising a reinforcement plate, bonded on a first surface side of the semiconductor substrate via an adhesive layer, for preventing damage to the semiconductor substrate.

4. The semiconductor device as set forth in claim 2, which comprises a solid-state image capturing device including:
    a reinforcement plate realized by a light transmissive member; and
    a charge coupled device (CCD) sensor disposed between the semiconductor substrate and the reinforcement plate.

5. The semiconductor device of claim 1, wherein the inner periphery surface of the third insulating film in the through hole is the surface closest to the center of the through hole.

6. The semiconductor device of claim 1, where the third insulating film is formed only on the inner wall of the through hole.

* * * * *